United States Patent [19]

Higgins

[11] Patent Number: 4,499,607

[45] Date of Patent: Feb. 12, 1985

[54] GEOMETRICALLY-INTEGRATED ARCHITECTURE OF MICROCIRCUITS FOR HIGH-SPEED COMPUTERS

[76] Inventor: David M. Higgins, 346 Palouse, Walla Walla, Wash. 99362

[21] Appl. No.: 417,508

[22] Filed: Sep. 13, 1982

[51] Int. Cl.³ .............................................. H04B 9/00
[52] U.S. Cl. .................................. 455/606; 339/17 N; 361/412; 455/617
[58] Field of Search ............. 361/412, 413; 339/17 N; 455/606, 607, 617; 365/52, 63, 64, 72

[56] References Cited

U.S. PATENT DOCUMENTS

| | | | |
|---|---|---|---|
| 2,872,664 | 2/1959 | Minot | 340/174 |
| 3,087,096 | 4/1963 | Jorgensen | 317/101 |
| 3,243,661 | 3/1966 | Ullery, Jr. | 317/101 |
| 3,704,455 | 11/1972 | Scarbrough | 340/173 SP |
| 3,755,891 | 9/1973 | Muckelroy et al. | 361/412 |
| 4,063,083 | 12/1977 | Cathey et al. | 455/607 |

FOREIGN PATENT DOCUMENTS 559444  2/1975  Switzerland .................. 361/412

OTHER PUBLICATIONS

"Supercomputers," Scientific American, Jan. 1982, pp. 120-135, Ronald D. Levine.
"The Superconducting Computer," Juri Matisoo, Scientific American, May 1980, pp. 50-65.

Primary Examiner—Joseph A. Orsino, Jr.

[57] ABSTRACT

A geometrically integrated microcircuit comprises a plurality of isosceles or equilateral truncated triangular (e.g., trapezoidal or hexagonal) integrated circuit chips or circuit boards arranged along the internal planes of a geometrical solid, such as a cube or cuboctahedron, to form a crystallike cell. The chips have beveled interfacing edge faces which include metal dowels, such as frozen mercury, providing both mechanical and electrical interconnections between the chips. The chips have opposed truncated edge faces including optical transceivers for transmitting and receiving signals along a line of sight between remote, coplanar chips across a central opening in each cell. Multiple such cells can be stacked in a regular three-dimensional array with the edge faces of the chips in adjoining cells aligned and interconnected along their length. Additional transceivers in other truncated edges of the chips are connected via optical fibers to external input/output devices or to other cells.

20 Claims, 13 Drawing Figures

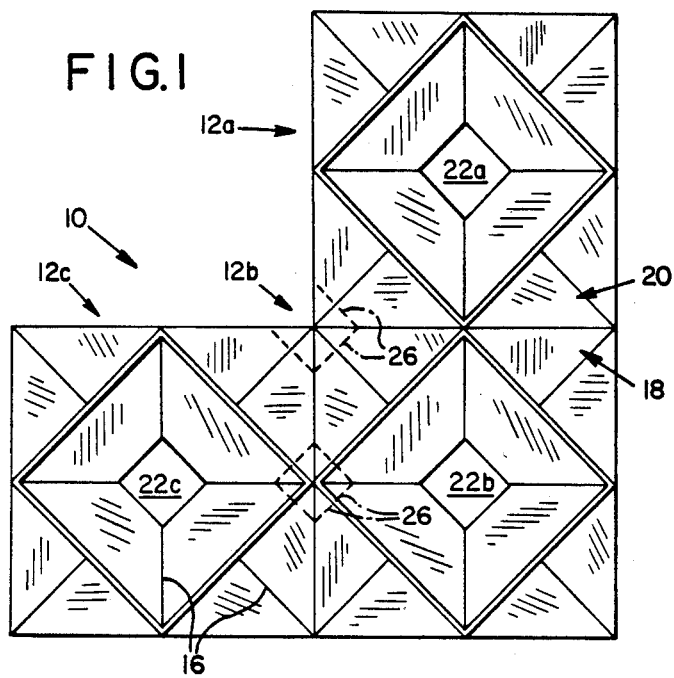
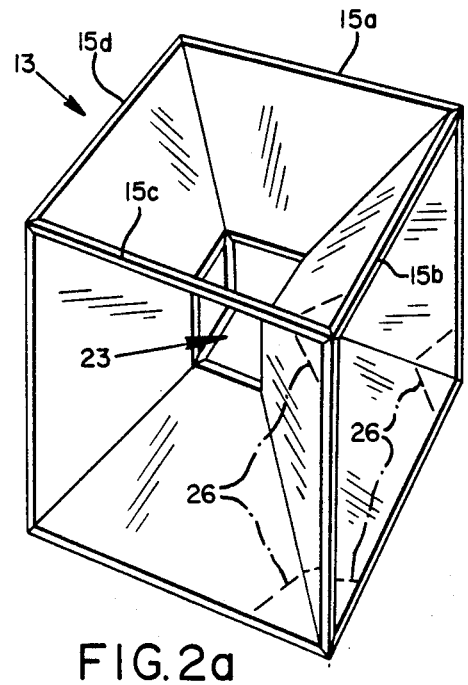
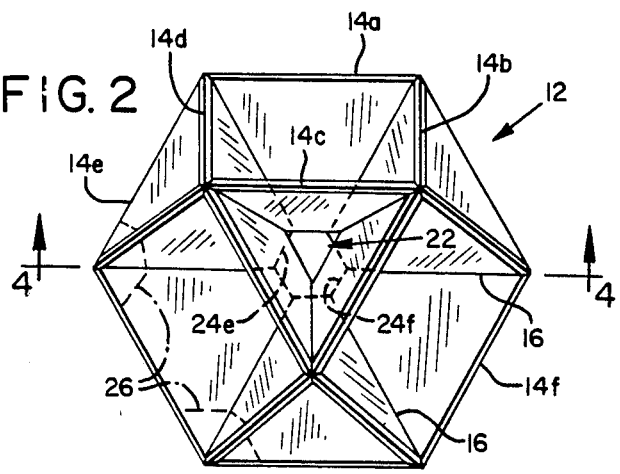
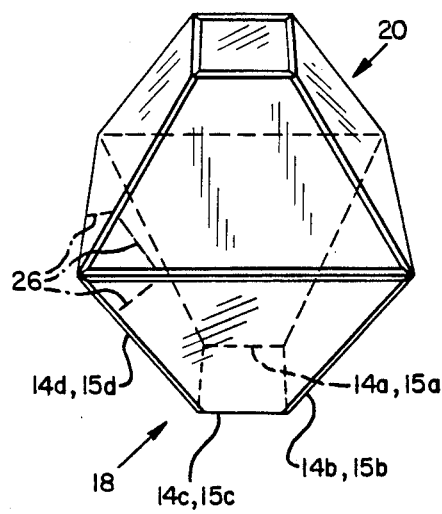
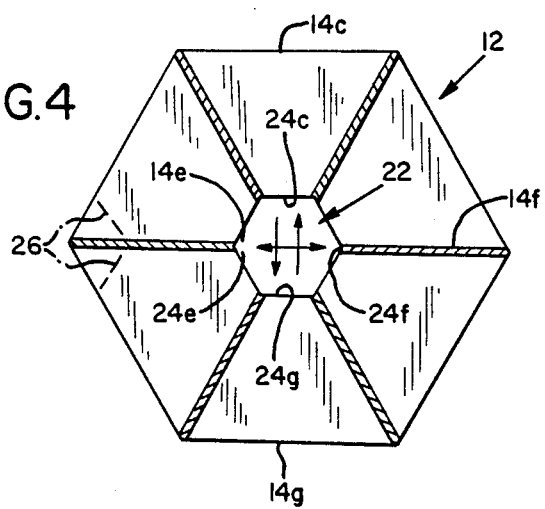

GEOMETRICALLY-INTEGRATED ARCHITECTURE OF MICROCIRCUITS FOR HIGH-SPEED COMPUTERS

BACKGROUND OF THE INVENTION

This invention relates to computer architecture and more particularly to the arrangement of circuit boards or chips in a computer or other highly-complex electronic circuit so as to maximize component density and minimize conduction path length to increase computing capacity and speed of operation.

A long-standing objective of computer design has been to increase both computing capacity and the speed of operation of computers of all sizes. In an article entitled "Supercomputer," Scientific American, January, 1982, pages 120–135, Ronald D. Levine details various attempts at attaining these goals in the very largest computers. The latest supercomputers are the CRAY-1 built by Cray Research, Inc. and the CYBER 205, built by Control Data Corporation. A variety of programming and structural innovations have been employed in these machines to maximize capacity and speed of operation.

Current performance levels of each machines—computing speeds in excess of 100 million operations per second—are due in significant part to the rapid advance of microelectronics, which through miniaturization has made available very dense memory and logic circircuitry having nanosecond switching speeds. At such high switching speeds, the speed of circuit operation is limited primarily by the speed at which signals can be propagated from one part of the machine to another. No signal can travel faster than the speed of light, which is close to one foot per nanosecond. In practice, the propagation speed of pulses through the wiring of supercomputers ranges from 0.4 to 0.9 feet per nanosecond. To reduce the cycle time of a computer to one nanosecond requires that the distance separating synchronous parts of the machine be appreciably less than one foot. The cycle times of existing supercomputers are roughly proportional to their linear dimensions, evidence that signal propagation speed is the primary limiting factor. In the CRAY-1 computer, average wire length is about four feet and cycle time is 12.5 nanoseconds. In the CRAY-2 computer, recently announced as being in the developmental stage, average wire length is 16 inches. It is expected to have a cycle time of four nanoseconds, still much slower than the switching speeds of the components. It would be desirable to further reduce conductor length to the point where signal propagation times are not a limiting factor in speed of operation.

Besides miniaturization, a variety of stacking techniques have been proposed to concentrate large numbers of circuits in small volumes. U.S. Pat. No. 3,087,096 to Jorgensen and U.S. Pat. No. 3,243,661 to Ullery, Jr. propose stacking parallel wafers in columns and electrically interconnecting them along the sides of the column. U.S. Pat. No. 2,872,664 to Minot and U.S. Pat. No. 3,704,455 to Scarbrough propose similar schemes for stacking and interconnecting computer memory circuit boards. Although the increasing density of integrated circuits has enabled substantial size reductions, the miniaturization of supercomputers is inhibited by the vast amount of memory and logic circuitry they require. In the CRAY-1 computer, more than 1,600 circuit boards in the machine's central processing unit are stacked in columns which, in turn, are arranged side by side in a cylindrical array. The circuit boards are interconnected inside the array by about 300,000 wires. The wires in each machine must be adjusted in length so that the signals between any two points deviate from a desired travel time by less than one nanosecond. It would be preferable to minimize such pains-taking tuning requirements.

In addition, concentrating a large amount of circuitry in a small volume to minimize the length of the wires creates a serious problem: the removal of waste heat generated by electrical energy conversions. Heat removal is critical because semiconductor failure rates increase rapidly with temperature. The aforementioned Levine article describes various techniques employed in supercomputers to provide adequate cooling and mathematical techniques used to detect and correct bit errors in the machines. The CRAY-2 computer employs liquid immersion technology to remove heat from its densely packed circuit modules. The application of cryogenics to computers has also been proposed in, for example, an article entitled "The Super-conducting Computer" by Juri Matisoo, Scientific American, May 1980, pages 50–65. Accordingly, it is important that arrangements of the chips or boards avoid localized heat concentrations and permit free flow of cooling fluid.

It is also desirable to simplify the electrical interconnection of boards or chips in complex circuits, particularly to avoid the maze of wiring used, for example, in the CRAY-1 computer. Matisoo proposes stacking the boards or cards to which the circuit chips are bonded in a parallel, spaced array and interconnecting the edges of the cards via perpendicular wiring modules. Electrical contact between the cards and the wiring modules is provided by solder joints in which a drop of mercury bridges a gap between two micropins, one in the card and the other in the wiring module. Whn the computer is immersed in liquid helium, the mercury solidifies. It would be preferable to minimize the need for either extrinsic wiring or separate wiring modules.

SUMMARY OF THE INVENTION

It is therefore a principal object of the invention to improve the physical architecture of computers and other complex electronic circuits constructed of many chips or circuit boards.

Another object of the invention is to physically arrange a plurality of operably interconnected electronic circuit chips or boards so as to minimize the length of interconnecting conductors.

A further object of the invention as aforesaid is to maximize the number of boards or chips to which a single board or chip can be operably connected without long conductors.

Yet another object is to enable very high speed signal transmission, approaching the speed of light, between remotely positioned circuit boards or chips.

An additional object is to provide a structure of chips or boards which can be readily used in a cryogenic or superconducting computer.

In accordance with the invention, the foregoing objects are realized in an arrangement of microcircuit chips along the internal planes of a crystallike geometrical solid. In this context, the term "solid" refers to a three dimensional or polygonal geometric shape. Adjoining chips are mechanically and electrically interconnected at interfacing edge faces extending along internal vectors of the solid. As used hereinafter, the term "chip" includes integrated circuit chips, multichip circuit boards, and hybrid chips or chipstrates.

In a preferred embodiment, integrated circuit chips formed in the shape of isosceles triangles are fitted together at their edge faces along the internal vectors of a regular solid, such as a cube or a cuboctahedron. Each cube, cuboctahedron or other geometric solid thus formed may be conveniently referred to as a cell. Each cell comprises at least two subcells of four chips interconnected edge to edge to form a four-sided pyramid. The base of each pyramid, which is open, can be connected to a like pyramid in an adjacent cell, enabling the geometric arrangement or array to be repeated indefinitely. The triangles are preferably truncated at their central vertices, thereby defining trapezoids, to provide each cell with an open center. The triangles can also be truncated at their noncentral vertices, thereby defining hexagons, to provide additional openings between cells in an array.

Several advantages accrue from such a structure. First, the extensive edge contact between chips provides ample space for numerous interconnections from one chip to the next. Secondly, each chip can be connected directly to many other chips without need for long conductors. For example, in a cuboctahedron, each is connected to six adjacent chips within the cell and can be connected to a seventh chip in an adjacent cell. In a cube, each chip is connected to four chips within a cell and can be connected to two more chips in an adjacent cell. In addition, the open center of the cell enables direct communication, preferably by optical or other line-of-sight means, between remote chips within the cell. Likewise, truncating the chips at concentral vertices enables direct communication between nonadjoining chips in adjoining cells. In this way, a chip in a cubic array can communicate directly, without wires, to up to nine other chips and in a cuboctahedron with up to ten other chips. Thirdly, the regular geometric shape of the cells densely yet uniformly packs the circuit components for ease of cooling. The open centers and radial arrangement of the cells also facilitate circulation of cooling fluid.

Each chip can be of the same shape. Simple circuits can be formed on the chips, which can be made very small and used in large numbers to form very large repetitive arrays of logic circuitry at low cost. At the same time, all or nearly all interconnections can be formed on or between the chips without extrinsic conductors. As mentioned above, the chips are preferably truncated triangles having their edge face formed, e.g., beveled, to mate with the edge faces of adjoining chips. Metal conductors of minimal length extend through the interfacing edge faces of adjoining chips to interconnect the chips both mechanically and electrically. The edge faces along the truncated vertices of the chips, referred to hereinafter as the unformed or truncated edge faces, can be provided with optical transceivers for transmitting and receiving signals between the electrical circuit on the chip and that of an opposed chip within the cell. If the chips are hexagonal, such transceivers can be provided on all three truncated edges. Input/output signals can be provided to the circuits via optical fibers connected to some of the transceivers.

The foregoing and other objects, features and advantages of the invention will become more readily apparent from the following detailed description of a preferred embodiment, which proceeds with reference to the accompanying drawings.

BRIEF DESCRIPTION OF THE DRAWINGS

FIG. 1 is a side elevational view of an array of cuboctahedral cells formed of truncated equilateral triangular chips interconnected along their edge faces, electrical circuitry and interconnections being omitted for clarity.

FIG. 2 is a perspective view of a single cuboctahedral cell of the array of FIG. 1.

FIG. 2a is a perspective view of a single cubic cell which can alternatively be used in the array of FIG. 1.

FIG. 3 is a perspective view of a pair of four-sided pyramidal subcells of adjacent cells of the array of FIG. 1 interconnected to form a truncated octahedron.

FIG. 4 is a cross-sectional view taken along line 4—4 in FIG. 2 showing paths of communication between remote chips.

DETAILED DESCRIPTION OF A PREFERRED EMBODIMENT

Figure 5:
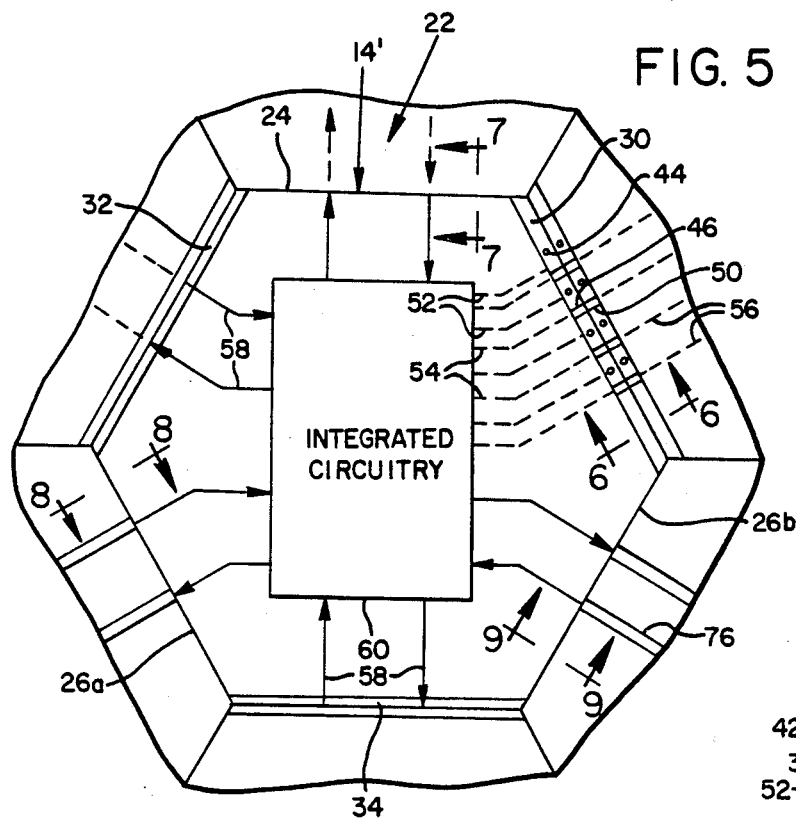
FIG. 5 is an enlarged view of a portion of an array similar to that of FIG. 1 showing a single chip in plan view, the chips being truncated on all three corners to define hexagons, portions of the array being removed to show interconnecting edge faces of the chips and details of interconnections.

Referring to FIG. 1, an electronic circuit array 10 comprises one or more like cells 12a, 12b, 12c interconnected in a regular crystallike structure. Referring to FIG. 2, a single such cell 12 comprises a plurality of semiconductor chips 14, each constructed on a planar substrate having a truncated isosceles triangular shape. In general, the chips are arranged along the internal planes of a geometric solid and interconnected to interface at their respective edge faces along internal vectors 16 of the solid.

One geometrical solid which provides a suitable arrangement of the chips for interconnection both within each cell and between cells is a cuboctahedron, shown in FIGS. 1, 2 and 4-6. A cuboctahedral cell comprises 24 identical equilateral triangular chips 14. Each chip has an edge interface with six other chips within the cell and, in an array of cells, with one chip in the adjoining cell, for a total of seven chips.

A suitable alternative geometric solid is a cube 13 comprising twelve chips 15 of a nonequilateral isosceles triangular shape. Within a cubic cell 13, each chip has an edge interface with four adjoining chips. Within an array of cubic cells, each chip also has an edge interface with two adjoining chips in an adjacent cell, or to a total of six adjoining chips.

Referring to FIG. 3, a subcell 18 comprises four chips 14a-14d interconnected along their edges to form a truncated, four-sided pyramid having an open base. A cuboctahedral cell 12 comprises six independent subcells 18, each connected side by side to two other subcells about a tetrahedron. The cubic cell 13 comprises two independent subcells 18 positioned end to end and four interconnecting chips. Within an array of cuboctahedral or cubic cells, each subcell is connected at its base to the base of an inverted subcell 20 of an adjoining cell.

Figure 7A:
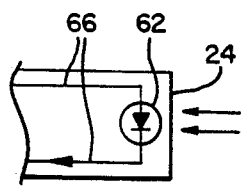
FIGS. 7a and 7b are cross-sectional views taken along line 7—7 in FIG. 6 showing details of an optical transceiver in the truncated edge face of a chip.
Figure 7B:
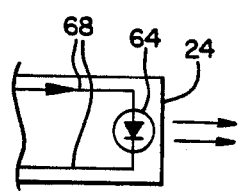

As mentioned above, each chip is a truncated isosceles or equilateral triangle. Such chips can be truncated at a single central vertex, as shown in FIGS. 1-4, thereby defining a trapezoid. Truncating each chip at the central vertex of the cell provides each cells 12, 13 with a central opening 22, 23. This opening has two principal purposes. One is to allow free circulation of cooling fluid through an array of cells. The other principal purpose is to enable line-of-sight communication between remote, opposed chips within each cell as described hereinafter. Chips 14e and 14f lie in the same plane and have truncated parallel edge faces 24e, 24f, respectively, mutually opposed across opening 22. Optical transceivers, further described below with reference to FIGS. 7a and 7b, are positioned in such to enable the line-of-sight bidirectional transmission of signals across opening 22 between chips 14e, 14f. Coplanar chips 14c and 14g have parallel opposed edge faces 24c, 24g likewise fitted with optical transceivers for signal transmission between those two chips as well. similarly, each other pair of coplanar chips within a cell is capable of communicating across opening 22.

Referring to FIG. 5, each triangular chip 14 can be alternatively truncated at all three vertices to define a hexagonal chip 14' having, in addition to central truncated edge face 24, a pair of peripheral truncated edge faces 26a, 26b. Truncating each chip along the remaining vertices, as indicated by dashed line 26 in FIGS. 1-4, thus provides additional space for transceivers similar to those in edge face 24 for transmission of signals between remote chips of adjacent cells. Hence, a single chip can communicate with up to 10 chips in a cuboctahedral array and 9 chips in a cubic array, without using any extended conductors.

Figure 6A:
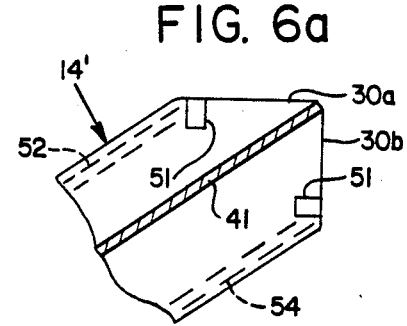
FIG. 6a is a further enlargement of the view of FIG. 6 showing two semiconductor wafers sandwiched together to form a single two-sided chip.
Figure 6:
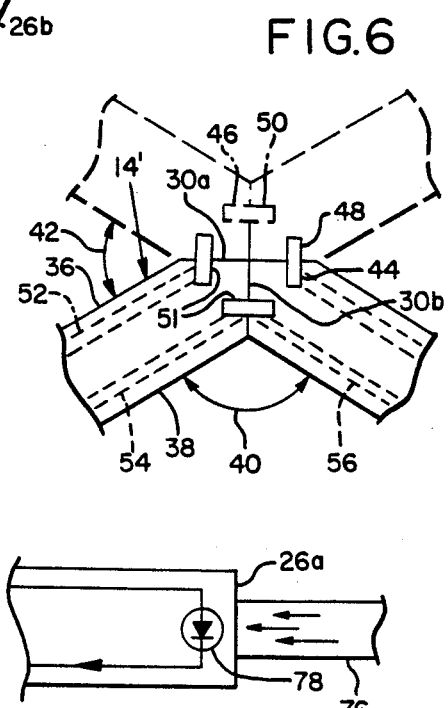
FIG. 6 is an enlarged sectional view taken along line 6—6 in FIG. 5 showing details of interconnections between four adjoining chips.

Referring to FIGS. 5 and 6, each chip has three formed edge faces 30, 32, 34, coinciding with the sides of a triangle, formed to mate with the edge faces of adjoining chips. Edge face 30 is preferably beveled to form a pair of perpendicular faces 30a, 30b angled relative to the broad circuit-bearing faces 36, 38 of the chip so as to abut or interface with adjoining chips edge to edge at angles 40, 42. Edge faces 32, 34 are similarly beveled. In a cuboctahedron, four chips meet along each internal vector at angle 40°=120° and angle 42°=60°. In a cube, three chips meet along each internal vector at angles of 120°. As shown in FIG. 6, the chip 14 is formed on a single substrate having both edge faces 30a, 30b beveled and circuits formed on both sides. Alternatively, referring to FIG. 6a, such chip comprises a pair of substrates sandwiched together about a suitable adhesive layer 41. The latter arrangement allows face 30a to be formed on one substrate and face 30b on the other before adhering the substrates together.

The chips are mechanically and electrically interconnected along the formed edge faces. Normal to each beveled edge face 30a, 30b is a row of cylindrical holes 44, 46 aligned with rows of cylindrical holes 48, 50 in the adjoining chips. Received in each hole is a metallic dowel 51 which provides a mechanical interconnection between the adjoining chips. In addition, electrical conductors 52, 54, from the electrical circuitry 60 on each of the broad faces of the chip extend to such holes and are electrically connected through dowels 51 to conductors 56 on the adjoining chips. During manufacture of the chips, the holes 44-50 are drilled by a laser or other suitable means. During assembly, the holes are filled with liquid mercury which solidifies when the assembled array is submerged in liquid helium. This interconnection arrangement is likewise used in beveled edge faces 32, 34, but for purposes of clarity is indicated more simply by arrows 58.

Referring to FIGS. 7a and 7b, the central truncated edge faces 24 of the chips contain optical transceivers for transmitting and receiving optical signals across control openings 22, 23. The transceivers each comprise a photoelectric receiving diode 62 and a light-emitting transmitter diode 64 ion-implanted into edge face 2 and connected by conductors 66, 68, respectively, to circuitry 60 on the chip.

Figure 8:
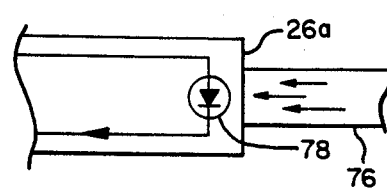
FIG. 8 is a cross-sectional view taken along line 8—8 in FIG. 5 showing an optical receiver coupled to an optical fiber for providing input signals to the chip.

Referring to FIGS. 5 and 8, optical transmitting and receiving elements like those of FIGS. 7a and 7a also implanted in truncated edge faces 26a, 26b to provide optical communications with remotely-positioned chips in adjacent cells. Such transceivers can alternatively be used to provide input/output communications circuit array 10 and external input/output devices. An optical signal can be input to the chip and thus to the whole array from an external input/output device (not shown) via an optical fiber 76 connected to a photo diode 78 on truncated face 26a. Photo diode 78 can be either an input photoelectric cell or a light-emitting diode depending upon whether fiber 76 is remotely connected to an input or an output device.

Figure 9A:
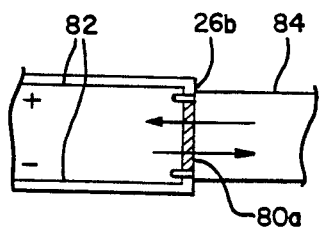
FIGS. 9a and 9b are cross-sectional views taken along line 9—9 in FIG. 5 showing alternate forms of optical transmitters coupled to optical fibers for transmitting output signals.
Figure 9B:
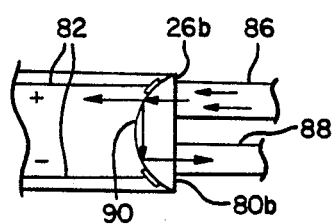

Referring to FIGS. 9a and 9b, as an alternative to light-emitting diodes 64, an optical gate 80a,80b is formed in truncated edge faces 26a,26b and connected via conductors 82 to appropriate biasing circuitry on the chip. Several different types of gating schemes can be used. In FIG. 9a, a single optical fiber 84 provides a steady state input light beam to a selectably reflective gate 80a, such as a liquid crystal, which is switched by biasing the gate via conductors 82 between reflective and nonreflective modes to reflect a modulated signal back out the optical fiber to a receiver at the source of the input beam. In a second alternative, illustrated in FIG. 9b, light is input through fiber 86 to a transparent semicircular silicon dioxide gate 80b whose index of refraction is controllable by biasing the gate via conductors 82 and which has, for example, a semicircular shape. At one index of refraction, the gate operates in the manner of a Porro prism to internally reflect light from fiber 86 out a return fiber 88. At a different index of refraction, most of the light is absorbed into the substrate through the interface 90 between the oxide gate material and the substrate.

Having illustrated and described the principles of my invention in a preferred embodiment and several variations thereof, it should be apparent to those skilled in the art that the invention may be modified in arrangement and detail without departing from such principles. I therefore claim as my invention all such modifications as come within the spirit and scope of the following claims.

I claim:

1. An electronic circuit chip for use in combination with a second said chip in a circuit physically configured as a geometrical solid, the chip comprising:

a planar substrate having a broad face and a straight edge face;

an electronic circuit on the broad face; and connecting means disposed along the edge face for electrically connecting the circuit to a second circuit on the second chip;

said edge face being formed to mate with a complementary edge face of said second chip to interconnect said chips edge to edge at an angle such that the broad faces of the chips are angularly spaced apart and vertices orient towards the center of said geometrical solid.

2. A chip according to claim 1 in which said substrate has three of said formed edge faces oriented to define a regular plane geometrical figure such that multiple of said chips can be radially arranged in a regular geometrical solid 3. A chip according to claim 2 in which said plane geometrical figure is truncated at a vertex such that the substrate has an additional non-abutting, straight edge face extending between two of said formed edge faces, the chip being symmetrical about a midpoint along said non-abutting edge face and said geometrical solid being arranged so that said non-abutting edge face parallels a like edge face on a third said chip remotely positioned within said solid.

4. A chip according to claim 3 in which the chip defines a trapezoid.

5. A chip according to claim 3 in which the chip defines a hexagon.

6. A chip according to claim 3 in which said non-abutting edge face includes optical transceiver means operatively connected to the electronic circuit for transmitting and receiving optical communications signals to and from said third chip.

7. A chip according to claim 1 in which the formed edge face is beveled so as to form a mitred corner with said second chip.

8. A chip according to claim 7 in which the connecting means comprises a conductive dowel means extending into the substrate and protruding therefrom for insertion into the second chip for mechanically interconnecting said chips.

9. A geometrically integrated microcircuit comprising:

at least three planar electronic polygonal circuit chips of like shape arranged said interconnected edge to edge so as to define a polyhedron;

each chip having straight edge faces beveled in complementary fashion to abut one another at an interface between at least two of said chips, each chip having an electronic circuit formed thereon; and electrical connecting means extending through each interface to electrically interconnect electric circuits on abutting chips.

10. A circuit according to claim 9 comprising at least two of said polyhedra interconnected along the straight edge faces of the chips so as to form a repetitive crystal-like monolithic array in which the chips are oriented towards the center of a geometrical solid.

11. A circuit according to claim 9 in which the polyhedron is a four-sided pyramid.

12. A circuit according to claim 11 in which six of said pyramids are interconnected to define a cuboctahedron.

13. A circuit according to claim 11 in which six of said pyramids are interconnected to define a cube.

14. A circuit according to claim 9 in which the polyhedron is truncated at a vertex to define a truncated edge face in each chip.

15. A circuit according to claim 14 in which at least two of said polyhedra are interconnected along the straight edge faces of the chips so as to form a crystal-like cell in which the chips are oriented towards the center of a regular geometrical solid, the cell having an open center defined by said truncated edged faces.

16. A circuit according to claim 15 in which said truncated edge faces include transceiver means for transmitting and receiving signals from remote chips along all planes of the array across said open center.

17. A circuit according to claim 15 in which multiple of said cells are interconnected in a regular geometrical array without extrinsic components.

18. A circuit according to claim 17 in which the polyhedra are truncated at a second vertex to define peripheral truncated edge faces, including transceiver means for transmitting and receiving communications signals.

19. An electronic circuit architecture comprising a plurality of circuit chips of isosceles triangular shape geometrically oriented towards the center of one of a cube and a cuboctahedron to define a cell having a central vertex;

the chips including interfacing edge faces defining said shape;

means for mechanically interconnecting adjoining chips in edge-to-edge abutting relationship along said edge faces;

and means extending through said edge faces for electrically interconnecting adjoining chips.

20. A circuit architecture according to claim 19 in which said chips are truncated at said central vertex to define a central opening in said cell for passage of cooling fluid.

* * * * *